United States Patent
Rottstegge et al.

(10) Patent No.: US 6,759,184 B2
(45) Date of Patent: Jul. 6, 2004

(54) AMPLIFICATION OF RESIST STRUCTURES OF FLUORINATED RESIST POLYMERS BY STRUCTURAL GROWTH OF THE STRUCTURES BY TARGETED CHEMICAL BONDING OF FLUORINATED OLIGOMERS

(75) Inventors: Jörg Rottstegge, Erlangen (DE);
Christian Eschbaumer, Schwaig (DE);
Christoph Hohle, Bubenreuth (DE);
Waltraud Herbst, Uttenreuth (DE);
Michael Sebald, Weisendorf (DE)

(73) Assignee: Infineon Technologies AG, Munich (DE)

(*) Notice: Subject to any disclaimer, the term of this patent is extended or adjusted under 35 U.S.C. 154(b) by 117 days.

(21) Appl. No.: 10/186,139

(22) Filed: Jun. 28, 2002

(65) Prior Publication Data

US 2003/0073043 A1 Apr. 17, 2003

(30) Foreign Application Priority Data

Jun. 28, 2001 (DE) .......................... 101 31 144

(51) Int. Cl.$^7$ .............................. G03F 7/00; G03F 7/30
(52) U.S. Cl. ...................... 430/322; 430/324; 430/325; 430/330; 430/331; 430/401; 430/414; 430/428; 430/432; 430/925
(58) Field of Search ................................ 430/322, 324, 430/325, 330, 331, 401, 414, 428, 432, 925

(56) References Cited

U.S. PATENT DOCUMENTS

| 5,173,393 A | * | 12/1992 | Sezi et al. .................. 430/323 |
| 5,234,793 A | | 8/1993 | Sebald et al. ............... 430/323 |
| 5,234,794 A | | 8/1993 | Sebald et al. ............... 430/325 |
| 6,042,993 A | * | 3/2000 | Leuschner et al. .......... 430/296 |
| 2003/0022111 A1 | * | 1/2003 | Falk et al. .................. 430/322 |

FOREIGN PATENT DOCUMENTS

| EP | 0 395 917 B1 | | 7/1990 | |
| JP | 2000-089477 | * | 3/2000 | ............. G03F/7/40 |

* cited by examiner

*Primary Examiner*—Nicole Barreca
(74) *Attorney, Agent, or Firm*—Laurence A. Greenberg; Werner H. Stemer; Ralph E. Locher

(57) ABSTRACT

A process for the post-exposure amplification of resist structures uses amplification of resist structures of fluorinated resist polymers by structural growth of the structures by targeted chemical bonding of fluorinated oligomers. In the first step, a fluorine-containing resist is applied to a substrate. After exposure and development of the resist, bonding of an amplification agent chemically amplifies the resist structures. A fluorine-containing amplification agent is preferably used to achieve an improved reaction between polymer and amplification agent due to the improved miscibility of the molecular chains.

12 Claims, No Drawings

AMPLIFICATION OF RESIST STRUCTURES OF FLUORINATED RESIST POLYMERS BY STRUCTURAL GROWTH OF THE STRUCTURES BY TARGETED CHEMICAL BONDING OF FLUORINATED OLIGOMERS

BACKGROUND OF THE INVENTION

FIELD OF THE INVENTION

The invention relates to a process for the post-exposure amplification of structured resists as used in the production of microelectronic components.

In order to increase the computational speed of processors, the storage volume of memory elements, and to reduce the costs of the components, chips that have increasingly small structures and hence an increasingly high density of components are being developed in the semiconductor industry. A particular challenge is the reduction of the minimum structure size. In optical lithography, reducing wavelengths has reduced the minimum structure size. At a structure size of 100 to 70 nm, the processes known to date, which use wavelengths down to 193 nm, have reached the limit of their resolution. Therefore, the development of novel processes is necessary. Optical lithography has particularly good prospects for potential industrial use, a radiation having a wavelength of 157 nm being used for exposure since the chip manufacturers can in this case continue to use their extensive knowledge in optical lithography. A substantial difficulty in using an exposure radiation having a wavelength of 157 nm is the unsatisfactory transparency of the materials used to date. For industrial use, the base polymer in these high-resolution resists must have a transparency that is as high as possible, while the photosensitive chemicals with which, for example, an acid is produced in the resist must have a high quantum yield.

Some of the resists currently used for the manufacture of microchips operate with so-called chemical amplification. Exposure in a photochemical reaction changes the chemical structure of the photoresist. In the case of a positive-working, chemically-amplified resist (for example, a strong acid which affects catalytic conversion or cleavage of the resist) is produced by the exposure. This chemical reaction dramatically changes the solubility of the polymer in a developer so that a substantial differentiation between exposed and unexposed parts is possible.

The structured photoresist can be used as a mask for further processes, for example, dry etching processes. If the photoresist is used to structure an organic chemical medium underneath, for example in two-layer resists, the photoresist disposed as the uppermost layer must have high etch resistance. For this purpose, the photoresist can either have corresponding groups in the polymer chain, for example, silicon-containing groups, or it is amplified in a step that follows the structuring of the photoresist. For this purpose, reactive groups must be present as anchor groups in the polymer. These then react with a suitable reactive group of an amplification reagent, which group acts as a linking group, with formation of a chemical bond. In this way, silicon-containing or aromatic groups can be subsequently introduced into the polymer. The etch resistance of aromatic and organosilicon compounds in oxygen plasma is substantially higher compared with aliphatic organic hydrocarbon compounds. Particularly for resist structures having a very small layer thickness, post-exposure amplification of the resist structures is therefore advantageous. The reaction for incorporating organosilicon compounds is often silylation, and the incorporation of aromatic compounds is referred to as aromatization.

A process for the post-exposure amplification of resist structures is described, for example, in European Patent EP 0 395 917 B1, which corresponds to U.S. Pat. Nos. 5,234,794 and 5,234,793. According to those patents, the photoresists used for exposure wavelengths of 248 and 193 nm are structured and then chemically amplified in their etch resistance by the incorporation of organosilicon groups and thus form a sufficiently stable etch resist. For this purpose, the film-forming polymer of the etch resist includes reactive groups: for example, anhydride groups. These anhydride groups react with basic groups of the silylating solution that contains, for example, bifunctional aminosiloxanes, amide bonds being formed between polymer and silylating reagent with crosslinking of the resist structure. Finally, excess silylating reagent is washed away with a suitable wash solution. Resists to be exposed to radiation having a wavelength of 248 or 193 nm permit layer thicknesses in the range from 140 to 200 nm. During the silylation, the amplification agent increases a volume in the horizontal and vertical direction. A narrowing of the valleys of the resist structure and hence an improvement in the resolution are therefore possible.

As already mentioned, the low transparency of the known photoresists at a wavelength of 157 nm is a substantial difficulty in the development of 157 nm technology. With the currently known photoresists, layer thicknesses of more than 50 nm can be realized. At present, photoresists having a high degree of fluorination are being developed. This makes it possible substantially to increase the transparency of the polymer at a wavelength of 157 nm. Nevertheless, these polymers have about 50 times higher absorption than the currently customary polymers in the industrially used resists for exposure to radiation having a wavelength of 193 or 248 nm. Even with these highly fluorinated polymers, only layer thicknesses of up to 200 nm are achieved. This creates problems with the structuring of the underlying material. Therefore, attempts have been made to increase substantially the layer thickness of the already structured photoresist. However, if the abovementioned processes of European Patent EP 0 395 917 B1 are used for this purpose, only unsatisfactory results are obtained.

SUMMARY OF THE INVENTION

It is accordingly an object of the invention to provide an amplification of resist structures of fluorinated resist polymers by structural-growth of the structures by targeted chemical bonding of fluorinated oligomers that overcomes the hereinafore-mentioned disadvantages of the heretofore-known devices of this general type and that provides a process for the post-exposure amplification of resist structures. The process can increase the layer thickness of an already structured photoresist for the 157 nm technology.

With the foregoing and other objects in view, there is provided, in accordance with the invention, a process for post-exposure amplification of structured resists. The first step of the process is applying a chemically amplified photoresist to a substrate. The photoresist includes an at least partially fluorinated film-forming polymer having acid-labile groups and hindered anchor groups for linking amplification agents. The acid-labile groups are eliminatable by acid and used for liberating polar groups to increase solubility of the polymer in polar developers The photoresist also includes polar groups attached to the polymer, a photo acid generator, and a solvent. The next step is drying the photoresist to yield a photoresist film. The next step is exposing section-by-section the photoresist film to produce an exposed resist containing a latent image. The next step is heating the exposed resist to a first temperature to convert the latent image into a chemical profile by liberating the polar groups on the polymer. The next step is developing the resist with a polar developer by detaching parts of the chemical profile containing liberated polar groups being detached from the substrate to yield a structured resist. The next step is applying an amplification agent to the structured resist. The amplification agent is at least partially fluorinated and has at least one linkage group for reacting with the anchor group of the polymer to link the amplification agent to the polymer. The next step is removing excess amplification agent.

A process for the post-exposure amplification of structured resists achieves the object. The process includes the following steps:

(a) applying a chemically amplified photoresist to a substrate; the photoresist including the following components:
   an at least partially fluorinated polymer including acid-labile groups that are eliminated under the action of acid and that liberate polar groups that increase the solubility of the polymer in aqueous alkaline developers; the polymer also includes anchor groups for linking amplification agents; the anchor groups can be-formed as a protected anchor group;
   a photo acid generator; and
   a solvent;

(b) drying of the photoresist to give a photoresist film;
(c) exposing section-by-section the photoresist film to yield an exposed resist containing a latent image;
(d) heating the exposed resist to a first temperature to convert the latent image into a chemical profile and liberate polar groups on the polymer;
(e) developing the resist with a polar developer, parts of the chemical profile containing polar groups of the polymer being detached from the substrate to produce a structured;
(f) optionally liberating the anchor groups from the protected anchor groups;
(g) applying an amplification agent to the structured resist, the amplification agent being at least partially fluorinated and having at least one linkage group that can react with the anchor group of the polymer and effecting linkage of the amplification agent to the polymer; and
(h) removing excess amplification agent.

The high degree of fluorination of the film-forming polymer contained in the photoresist makes the resist increasingly hydrophobic. The interaction between the film-forming polymer and the amplification agent is also changed thereby. The amplification agents currently used generally contain alkyl or aryl groups that are only slightly miscible with the molecular chains of the polymer. This leads to separation and microphase separation of the components and results in only slight post-exposure amplification if the process disclosed in European Patent No. EP 0 395 917 B1 is applied to photoresists containing fluorine-containing polymers. In the process according to the invention, the amplification reagent is adapted in its chemical properties to the fluorine-containing polymer of the photoresist. Owing to the better chemical compatibility of polymer and amplification agent, reaction between the anchor group of the polymer and the corresponding linkage group of the amplification agent takes place more readily. This makes it possible to achieve a substantial increase in the layer thickness of the structured resist. By incorporating a larger proportion of silicon-containing groups or aromatic groups, the resistance of the structured resist to an oxygen plasma consequently increases. If polymers that permit larger layer thicknesses of the photoresist owing to their higher transparency at a wavelength of 157 nm are used, the structured resist can also be subsequently expanded in the horizontal direction by the fluorine-containing amplification agent, so that valleys of smaller diameter are obtained.

DESCRIPTION OF THE PREFERRED EMBODIMENTS

The process is conducted in general by a procedure in which first a substrate, in general a silicon wafer, that may also have been structured in preceding process steps and in which electronic components may also have already been integrated, is coated with the resist. The resist contains a fluorine-containing polymer. Multilayer resists including fluorine-containing polymer in the uppermost layer can be used.

Multilayer resists permit better focusing of the beam used for exposure onto the surface of the substrate.

All polymers that have acid-labile groups in the chain or as side groups, and therefore a low solubility in polar solvents, can be used as a film-forming fluorinated polymer. The catalytic action of acid and optionally a simultaneous thermal treatment produces polar groups on the polymer. For example, the following protective groups may be used as acid-labile groups: tert-alkyl ester, tert-butyl ester, tert-butoxy-carbonyloxy, tetrahydrofuranyl, tetrahydropyranyl, tert-butyl ether, lactone, and acetal groups. The acid-labile groups are preferably bonded to groups of the polymer which permit a high transparency of the polymer and hence of the resist layer for radiation of a very short wavelength of about 157 nm. Examples are 1,1,1,3,3,3-hexafluoro-2-hydroxyisopropyl groups; the hydroxyl function is protected by a tert-butyl ether, tert-butoxycarbonyloxy, tetrahydrofuranyl, tetrahydropyranyl or acetal radical, or another radical that can be eliminated by acid. In addition to the acid-labile groups, further groups which can be used directly as reaction anchors for the subsequent chemical amplification may be present in the polymer. For example, these can be anhydride groups, acid groups, such as carboxyl groups, phenolic, or other acidic alcoholic hydroxyl groups.

The film-forming polymer may also contain basic groups, such as amino groups, as anchor groups for the subsequent chemical amplification. These groups are initially protected by a corresponding protective group, e.g. a tert-butoxycarbonyloxy group, which is eliminated in the exposed parts.

In addition, those groups that improve the lithographic properties of the resist or its etch resistance, for example silicon-containing or aromatic groups, may be present, in the polymer.

Photo acid generators used may be all compounds that liberate an acid on exposure to radiation. Onium compounds as described, for example, in European Patent Application No. EP 0 955 562 A1 are advantageously used. Preferred photo acid generators are ionic compounds in the form of sulfonium salts and iodonium salts.

Methoxypropyl acetate, cyclopentanone, cyclohexanone, -butyrolactone, ethyl lactate, diethylene glycol diethyl ether, diethylene glycol dimethyl ether, or a mixture of at least two of these solvents may be used as a solvent for the resist.

However, possible solvents include all customary solvents or mixtures thereof in which the components of the resist can be dissolved to give a clear, homogeneous solution having a long shelf life and which ensure a good layer quality during the coating of the substrate.

The photoresist may additionally contain a thermo acid generator. Suitable thermo acid generators are, for example, benzylthiolanium compounds.

In addition, further components that improve resolution of the resist system, film formation properties, shelf life, radiation sensitivity, pot life effects, etc. can be added to the photoresist.

The chemically amplified resist contains the abovementioned components in general in the following amounts. The amounts are based on the weight of the resist.

Film-forming polymer: 1 to 50% by weight, preferably 2 to 10% by weight;

Photo acid generator: 0.01 to 10% by weight, preferably 0.1 to 1% by weight; and Solvent: 50 to 99% by weight, preferably 88 to 97% by weight.

If the photoresist contains a thermo acid generator, this is present in an amount of 0.01 to 5% by weight, preferably 0.05 to 1% by weight.

To bond chemically the amplification agent, the film-forming polymer of the resist contains reaction anchors: for example, carboxylic acid groups, sulfonic acid groups, and phenolic and other hydroxyl groups As a basic group, for example, an amino group can be provided as a reaction anchor in the film-forming polymer. The amplification agent also can bond to other reactive groups of the polymers for example, an epoxide, a glycidyl ether, or an isocyanate group.

The photoresist is applied by known techniques to the substrate: for example, by spin-coating, spraying, or immersing.

The solvent contained in the photoresist is removed by drying and the dried photoresist film is then exposed. Exposure is effected by customary processes, for example with the aid of a photo mask or by direct exposure, for example to an electron beam. Preferably, short-wave light, in particular radiation having a wavelength of 157 nm, is used for the exposure. In the exposed parts, an acid that eliminates the acid-labile protective groups of the polymer is liberated from the photo acid generator. The acid is catalytically effective; i.e. a large number of acid-labile protective groups can be eliminated by one liberated proton. Consequently, the photoresist is very sensitive to the incident quantity of light., The elimination of the acid-labile groups of the polymer can be accelerated by treatment at elevated temperature. For this purpose, the substrate with the applied resist is heated so that substantial elimination of the acid-labile protective groups in the exposed parts takes place. Because polar groups, such as, for example, carboxylic acid groups or acidic hydroxyl groups, are liberated by the elimination of the acid-labile groups, a substantial differentiation in the solubility of the polymer in polar developers between the exposed and unexposed parts is achieved.

After the thermal treatment, the exposed resist is treated with a polar developer, the polymer being detached from the substrate in the exposed parts in which the polymer is more polar. The type of developer need depends on the polar groups that are liberated by the exposure and subsequent heating. If basic groups on the polymer are liberated, e.g. amino groups, an acidic aqueous developer is used. If acidic groups are liberated on the polymer, e.g. carboxylic acid groups, it is possible to use, for example, an aqueous tetramethylammonium hydroxide solution. A structured resist in which the substrate or the layers disposed under the photoresist is or are bared in the exposed parts is obtained, whereas the unexposed parts are still protected by the solid photoresist film. If the remaining structured resist already has reactive groups for the subsequent chemical amplification, such as, for example, anhydride groups or acidic or basic groups, a reaction with the amplification agent for the subsequent chemical amplification can take place directly. If the resist has no anchor groups, elimination of the acid-labile protective groups still present in the unexposed parts functionalizes the structured resist for the post-exposure amplification. If the resist contains a thermo acid, the protective groups in the unexposed parts are eliminated in a subsequent heating step that is higher than all previous heating steps. The temperatures reached in this step range from 80 to 200° C. Alternatively, floodlight exposure with a subsequent heating step can be used. In this heating step, temperatures in the range from 60 to 170° C. are used. In the structured resist, acidic, functional groups, such as, for example, carboxylic acids or acidic hydroxyl groups, for example phenols, are now also present for the subsequent chemical amplification with organofluorine compounds provided with basic functional groups.

For the subsequent chemical amplification, the amplification agent is applied to the structured resist. The amplification agent may be applied from the gas phase. Preferably, however, the amplification agent is applied in the form of a solution to the structured resist. A suitable solvent for the amplification reagent is, for example, hexanol, isopropanol, heptane, decane, or a mixture of at least two of these solvents. In general, however, all solvents or mixtures thereof that can dissolve the components of the amplification agent to give a clear, homogeneous solution having a long shelf life can be used. Furthermore, the solvent should not dissolve the structured resist and should not react with those functional groups on the film-forming polymer and on the amplification agent that are required for the subsequent chemical amplification.

The solution for the subsequent chemical amplification may contain a reaction accelerator for swelling and/or stabilizing the reaction products. For example, water, low molecular weight alcohols, such as, for example, methanol or ethanol, and low molecular weight aldehydes and ketones, such as acetone, may be added to the solution as reaction accelerators.

In order to increase the miscibility with the film-forming fluorine-containing polymer, the amplification agent is completely or at least partially fluorinated. Preferably, the amplification agent is an alicyclic, polycyclic, or aromatic organofluorine compound. Aromatic organofluorine compounds are particularly preferred because they substantially increase the etch resistance of the subsequently amplified resist to an oxygen plasma. Silicon-containing groups, as predominantly used in the processes employed industrially to date, are problematic when used with fluorine-containing film-forming polymers. During the etching of the resist, fluorine can react with the silicon and lead to the formation of volatile silicon tetrafluoride. This reduces the etch resistance of the subsequently treated resist. Furthermore, the silicon tetrafluoride formed can lead to contamination of the apparatuses used.

In addition to the fluorinated hydrocarbon radicals, the amplification agent must include at least one linkage group that permits linkage of the amplification agent to the anchor group of the film-forming polymer. The chemical nature of the linkage group depends on the chemical character of the anchor group of the polymer. If the anchor group of the polymer has an acidic character, for example a carboxylic acid group or an acidic phenolic hydroxyl group, the amplification agent must have a basic group. If the film-forming polymer includes a basic group, for example an amino group, as the anchor group, the amplification agent must correspondingly have an acidic group. Groups that have neither acidic nor basic character, for example anhydride or epoxy groups, can react with corresponding nucleophilic groups. For this purpose, the amplification agent may have, for example, a hydroxyl or an amino group.

An amino group is preferably used as the linkage group of the amplification agent having basic properties. If the anchor group on the film-forming polymer is a carboxylic acid group or a carboxylic anhydride group, the amplification agent is bonded during formation of an amido group. The simplest amplification agents of this type are, for example, trifluoromethylamine or pentafluoroaminobenzene. Further preferred fluorine-containing amines are given in the following list.

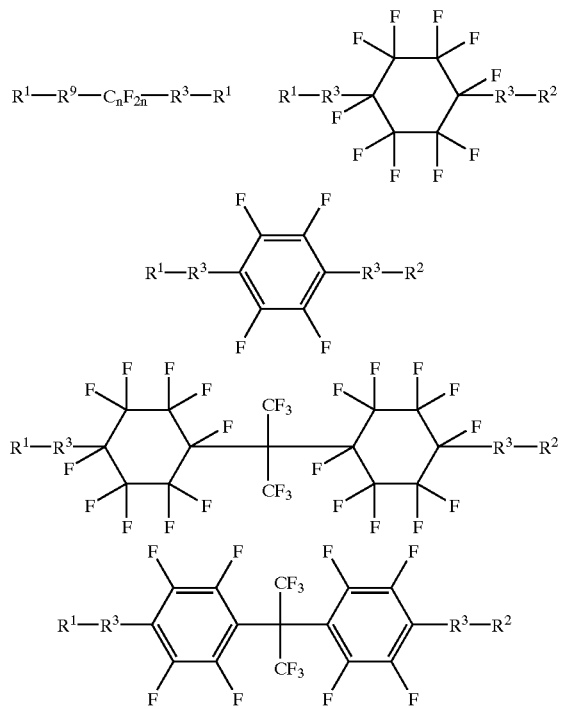

$R^1$ represents an —$NH_2$ group, $R^2$ represents a $CH_3$, a $CH_2F$, a $CHF_2$, a $CF_3$ group, or an $NH_2$ group, $R^3$ represents a single bond or an alkylene group having 1 to 10 carbon atoms. The alkylene group can be partially or completely fluorinated. In addition, n represents an integer between 1 and 10.

In addition to the compounds described, it is also possible to use isomers thereof which have other substitution patterns on the phenyl or cyclohexyl ring. One or more fluorine atoms can also be replaced by hydrogen, provided that at least one fluorine atom is present in the amplification agent.

If basic groups, for example an amino group, are present as anchor groups in the film-forming polymer, the linkage group of the amplification agent is preferably a carboxylic acid group, a sulfonic acid group, or an acidic hydroxyl group. Suitable fluorinated amplification agents include trifluoroacetic acid or pentafluorophenol. Furthermore, the compounds described in the case of the basic amplification agents may also be used, but $R^1$ is an $SO_3H$, a $COOH$ or an $OH$ group and $R^2$ is selected from the group including —$CH_3$, —$CH_2F$, —$CHF_2$, —$CF_3$, —$COOH$, —$SO_3H$, and —$OH$.

The bond of the amplification agent to the film-forming polymer is preferably effected by forming a covalent bond between linkage group and anchor group. For example, an amido group or an ester group are formed between amplification agent and film-forming polymer. However, the bond can also be effected, for example, by a nucleophilic substitution reaction, for example an ether bond being formed.

The bond of the amplification agent to the film-forming polymer need not be a covalent bond. The amplification agent can be linked to the polymer by an acid-base reaction: a salt being formed by the anchor group and the linkage group. The advantage of this reaction is that such acid-base reactions occur very rapidly. Consequently, the process times can be advantageously reduced.

In order to reduce the duration of the subsequent chemical amplification reaction, a reaction accelerator also can be applied to the structured resist together with the amplification agent. Suitable reaction accelerators for swelling the structured resist and for stabilizing the reaction products are, for example, water, low molecular weight alcohols, such as, for example, methanol or ethanol, and low molecular weight aldehydes and ketones, such as, for example, acetone.

The fluorine-containing polymer used in the resist has a comparatively high transparency at short wavelengths. The radiation used for the exposure of the dried resist therefore preferably has a wavelength of less than 200 nm, in particular 157 nm.

The invention is explained in more detail with reference to an example.

A polymer of 50 mol % of trifluoromethacrylic acid and 50 mol % of tert-butyl methacrylate is prepared by free radical copolymerization, and a 200 nm thick resist layer is produced on a silicon substrate using the polymer. The layer is then treated with a 10% strength solution of bisaminodifluoroxylol in chloroform. An increase in layer thickness of 30 nm is observed in 60 seconds.

We claim:

1. A process for post-exposure amplification of structured resists, which comprises the steps:
applying a chemically amplified photoresist to a substrate, the photoresist including:
an at least partially fluorinated film-forming polymer having acid-labile groups and hindered anchor groups for linking amplification agents, the acid-labile groups being eliminatable by acid and used for liberating polar groups to increase a solubility of the polymer in polar developers;
polar groups attached to the polymer;
a photo acid generator; and
a solvent;
drying the photoresist to yield a photoresist film;
exposing section-by-section the photoresist film to produce an exposed resist containing a latent image;
heating the exposed resist to a first temperature to convert the latent image into a chemical profile by liberating the polar groups on the polymer;
developing the resist with a polar developer by detaching parts of the chemical profile containing liberated polar groups from the substrate to yield a structured resist;
applying an amplification agent to the structured resist, the amplification agent being at least partially fluorinated and having at least one linkage group for reacting with the anchor group of the polymer to link the amplification agent to the polymer; and removing excess amplification agent.

2. The method according to claim 1, which farther comprises:

protecting the anchor group in the polymer; and liberating the anchor groups before applying the amplification agent.

3. The process according to claim 1, wherein the amplification agent is an organofluorine compound selected from the group consisting of alicyclic, polycyclic, and aromatic organofluorine compounds.

4. The process according to claim 1, wherein the linkage group of the amplification agent is acidic.

5. The process according to claim 1, wherein the linkage group of the amplification agent is basic.

6. The process according to claim 1, wherein the linkage group of the amplification agent is an amino group.

7. The process according to claim 1, wherein the linkage group of the amplification agent is selected from the group consisting of a carboxylic acid group, a sulfonic acid group, and an acidic hydroxyl group.

8. The process according to claim 7, wherein the acidic hydroxyl group is phenolic.

9. The process according to claim 1, wherein the linkage of the amplification agent: to the film-forming polymer is a covalent bond between the linkage group and the anchor group.

10. The process according to claim 1, which further comprises linking the amplification agent to the polymer in an acid-base reaction to form a salt from the anchor group and the linkage group.

11. The process according to claim 1, which further comprises applying a reaction accelerator to the structured resist together with the amplification agent.

12. The process according to claim 1, wherein the wavelength of the radiation is 157 nm.

* * * * *